United States Patent
Pearce et al.

(10) Patent No.: US 6,906,536 B2
(45) Date of Patent: Jun. 14, 2005

(54) TIME DIVISION MULTIPLEXED, PILOTED CURRENT MONITORING IN A SWITCHED MODE DC—DC VOLTAGE CONVERTER AND PHASE CURRENT MEASUREMENT CALIBRATION FOR A MULTIPHASE CONVERTER

(75) Inventors: Lawrence George Pearce, Palm Bay, FL (US); William David Bartlett, Melbourne Beach, FL (US)

(73) Assignee: Intersil Americans Inc., Milpitas, CA (US)

( * ) Notice: Subject to any disclaimer, the term of this patent is extended or adjusted under 35 U.S.C. 154(b) by 0 days.

(21) Appl. No.: 10/720,794

(22) Filed: Nov. 24, 2003

(65) Prior Publication Data

US 2004/0196055 A1 Oct. 7, 2004

Related U.S. Application Data

(60) Provisional application No. 60/459,668, filed on Apr. 2, 2003, and provisional application No. 60/459,676, filed on Apr. 2, 2003.

(51) Int. Cl.[7] .......................... G01R 27/08; G05F 1/565
(52) U.S. Cl. ....................... 324/713; 323/282; 323/290
(58) Field of Search ................................. 324/713, 725; 363/21.09, 56.01; 323/282, 290

(56) References Cited

U.S. PATENT DOCUMENTS

| | | | |
|---|---|---|---|
| 6,448,746 B1 * | 9/2002 | Carlson ....................... 323/272 |
| 6,534,998 B1 * | 3/2003 | Omura et al. ............... 324/536 |
| 6,806,689 B2 * | 10/2004 | Schuellein et al. ......... 323/272 |
| 6,812,722 B2 * | 11/2004 | Throngnumchai et al. .. 324/760 |
| 2003/0233202 A1 * | 12/2003 | Bardsley ...................... 702/64 |

* cited by examiner

*Primary Examiner*—Anjan Deb
*Assistant Examiner*—M. Kramskaya
(74) *Attorney, Agent, or Firm*—Allen, Dyer, Doppelt, Milbrath & Gilchrist, P.A.

(57) ABSTRACT

An arrangement for measuring current through a phase section of a buck mode DC-DC converter includes an auxiliary integrated circuit containing an auxiliary power MOSFET and a pilot MOSFET coupled in parallel with a current path through a high side MOSFET of a half-bridge of the converter. The pilot MOSFET has a current path coupled to a current measurement terminal. The MOSFETs of the auxiliary circuit are time division multiplexed with the high side MOSFET, whereby a determination of current through the auxiliary high side MOSFET is based upon current through the pilot device and the geometric ratio of the size of the pilot device to that of the high side auxiliary MOSFET. The high side MOSFET is activated for a large number of switching cycles relative to the pilot circuitry, but the pilot circuitry is activated sufficiently often to derive a relatively accurate measure of current flow.

20 Claims, 4 Drawing Sheets

TIME DIVISION MULTIPLEXED, PILOTED CURRENT MONITORING IN A SWITCHED MODE DC— DC VOLTAGE CONVERTER AND PHASE CURRENT MEASUREMENT CALIBRATION FOR A MULTIPHASE CONVERTER

CROSS-REFERENCE TO RELATED APPLICATIONS

The present application claims the benefit of now abandoned U.S. Provisional Applications, Ser. No. 60/459,668 filed Apr. 2, 2003 by L. Pearce, entitled: "Time Division Piloted Current Monitoring In Switching DC-DC Converters," and Ser. No. 60/459,676, filed Apr. 2, 2003, by W. Bartlett, entitled: "Phase Current Measurement Calibration," each application being assigned to the assignee of the present application and the disclosures of which are incorporated herein.

FIELD OF THE INVENTION

The present invention relates in general to DC power supplies and components therefor, and is particularly directed to a new and improved current measurement and calibration architecture for a half-bridge phase of a buck mode DC-DC voltage converter.

BACKGROUND OF THE INVENTION

Accurate measurement of current in a half-bridge phase of a buck mode DC-DC voltage converter, a reduced complexity diagram of which is shown in FIG. 1, has become a fundamental design issue in many CPU core power applications. Current measurement information is applied to three basic application objectives. The first, and usually the least demanding, is to identify an overcurrent condition. The second involves current balancing, either between different phases of a multiphase system, or between parallel configured DC-DC control systems that supply a common power node. The former situation is typically more demanding, and is directed at evenly distributing thermal effects and allowing lower current and power safety margins on the phase components (e.g., switching MOSFETs). The third objective, which is by far the most demanding need for accurate and precise current data, is the load-line specification for CPU systems. This effectively corresponds to a DC output impedance that would represent a much too high efficiency loss, if it were actually implemented with an output resistor. As a result the load-line is achieved by modulating the set-point voltage for the converter based on the current demand of the load. The basic problem being addressed is to monitor the current flowing into the load.

The half-bridge circuit of FIG. 1 is comprised of a high side NMOSFET 10 whose source-drain path is coupled in series with the source-drain path of a low side NMOSFET 20 between a power source 30 and ground (GND). Associated with the high side MOSFET 10 is a parasitic on-resistance $R_{DSON10}$, while low side MOSFET 20 has a parasitic on-resistance $R_{DSON20}$. An output inductor 40, which is coupled between a common phase node 15 and an output node 25, to which capacitor 35 and load 37 are coupled, has an effective series resistance ESR that is represented by parasitic resistor 50.

Although use may be made of only the above-referenced parasitic resistances of the half-bridge obtaining indirect measurement of the inductor current, each element has practical problems associated with it. For one thing, all three resistive components have manufacturing tolerances that must either satisfy system accuracy requirements or require calibration. Also, all three resistive elements have temperature dependencies which must be compensated if an accurate current measurement is to be inferred from the respective stages. Moreover, in all cases, if the converter is efficient, the voltages across these components are small so that noise is a concern.

For either of the two $R_{DSON}$s the voltage measurement must be conducted during the time that the respective MOSFET is in the ON state (conducting). This requirement entails the difficulty of avoiding switching transients in the $R_{DSON}$ waveform. The high side (HS) $R_{DSON10}$ measurement typically must be conducted during a very narrow time window due to voltage step down, and additionally the phase voltage at 15 must be referenced to the input power voltage. The low side (LS) $R_{DSON20}$ measurement has a longer measurement interval available, but requires the measurement of a ground-referenced voltage that goes below ground. For the ESR, the DC component of a triangular waveform voltage is desired, so that filtering is implicit.

Of course, an auxiliary 'measurement' resistor could be inserted into any of the branches of the half-bridge to facilitate current measurement. However, doing so would introduce additional power dissipation losses and extra components in the design. As a consequence, measurement resistors are typically avoided if possible.

FIG. 2 diagrammatically illustrates a modification of the half-bridge of FIG. 1 to include a (relatively small area) pilot or current mirror NMOSFET 12 associated with the high side NMOSFET 10. The pilot device 12 has its gate and drain electrodes coupled in common with the respective gate and drain electrodes of the high side NMOSFET 10, while the source of the pilot device 12 is coupled to current monitoring circuitry 70. A determination of the current flow through the high side MOSFET 10 is based upon the current flowing through the pilot device 12 and the geometric ratio of the size of the pilot device 12 to that of the high side MOSFET 10. Although not explicitly shown it is understood that the current monitoring circuitry 70 must match the voltages on the source terminals of NMOSFETs 10 and 12. Because the pilot device 12 and the high side MOSFET 10 are located on the same substrate or die, thermal compensation is implicit. A principal disadvantage of this architecture is the necessity of using a specialized MOSFET (comprised of the combination of the high side MOSFET and its associated pilot device).

FIG. 3 diagrammatically illustrates a piloted approach that is similar to that of FIG. 2, except that the high side devices are PMOSFETs. This has the advantage of allowing relatively easy matching of the gate-to-source voltage in the high side PMOSFET 10 and the pilot device 12, while extracting the current measurement from the drain of the pilot device. Again the current monitoring circuitry 70 provides voltage matching for the drains of PMOSFETs 10 and 12. A disadvantage is the reduced performance of PMOS device compared with an NMOS device. Also a PMOS device is more costly and requires more gate drive than a comparable NMOS device.

In either of the piloted approaches of FIGS. 2 and 3, the easiest implementation is that where the power MOSFET, pilot MOSFET and current measurement circuitry are integrated together. However, this leads to a very expensive power transistor, when compared to using a discrete MOSFET. As a result, conventional piloted current measurement designs require a tradeoff between significant price (associated with cost of production) and performance.

SUMMARY OF THE INVENTION

Pursuant to a first aspect of the present invention, the above-discussed problems associated with conventional piloted designs are substantially reduced by configuring the basic half-bridge architecture of FIG. 1 as a time-division multiplexed piloted circuit architecture, wherein current measurements conducted by auxiliary pilot-based current measurement circuitry are conducted on an intermittent basis (such as periodically) relative to the activation frequency of a high side or low side MOSFET with which the pilot-based current measurement circuitry is associated.

In accordance with a non-limiting embodiment, the pilot-based current measurement circuitry is comprised of a pair of auxiliary MOSFETs that are coupled with a high side MOSFET of the half-bridge phase of a buck mode DC-DC voltage converter. The auxiliary MOSFETs include a relatively small area pilot MOSFET and a companion, larger area MOSFET, whose ON conductance is a prescribed reduced fraction (e.g., one-fourth) of the high side MOSFET. Since the ON conductance of a MOSFET scales with device area, the lower conductance allows a smaller and consequently cheaper companion MOSFET. Although this reduced area produces a larger instantaneous power dissipation than in the high side MOSFET, it is relatively small on a time-averaged basis (over tens to hundreds of switching cycles).

An NMOSFET (PMOSFET) pilot device has its gate and drain (source) electrodes coupled in common with the respective gate and drain (source) electrodes of the high side auxiliary NMOSFET (PMOSFET), while the source (drain) of the pilot device is coupled to current monitoring circuitry. The gates of the two auxiliary MOSFETs are driven by a condition responsive control circuit, such as a sequentially clocked counter or a load transient responsive circuit that is intended to activate the pilot circuitry only in the event of an output anomaly.

As in the architecture of FIG. 2, described above, a determination of the current flow through the auxiliary high side MOSFET is based upon the current flowing through the pilot device and the geometric ratio of the size of the pilot device to that of the high side auxiliary MOSFET. Pursuant to the invention, the pilot circuitry is activated on a reduced frequency, time division multiplexed basis relative to that of the high side MOSFET—for example, once for every 20 to 1000 cycles for the high side MOSFET. This leads to a very efficient operation, as the high side MOSFET is activated for a large number of switching cycles relative to the pilot circuitry, but the pilot circuitry is activated sufficiently often to derive a relatively accurate measure of current flow.

In accordance with a second aspect of the invention, a pilot (current mirror) transistor is used to derive an accurate scaled version of current flow in the high side MOSFET of a selected phase of a multiphase DC-converter. This scaled version of current flow value is then ratioed with a current measurement derived by sensing the voltage drop across the on-resistance $R_{DSON}$ of the low side MOSFET for that phase, so as to produce a current ratio proportionality constant. Current measurements for the remaining phases are conducted by sensing the voltage drops across the respective on-resistances $R_{DSON}$ for those phases and then adjusting the measured values by the proportionality constant. Variables in this technique are how well the MOSFETs in each phase are matched to one another, and the range of variation of the absolute value of MOSFET on-resistance. This latter factor is the limiting factor in determining the accuracy of the current measurements.

Pursuant to a third aspect of the invention, the time division multiplex methodology of the first embodiment is substituted for the pilot current measurement scheme carried out in the second embodiment to derive the current measurement scaling factor of the second embodiment. Namely, the current mirror or pilot transistor of the second embodiment is replaced by the auxiliary circuitry of the first embodiment, containing the relatively small area pilot MOSFET switch and its companion larger area MOSFET. As in that embodiment, the pilot circuitry in a respective phase section of the second embodiment is activated on a reduced, time division multiplexed basis relative to that of the high side MOSFET. This periodically measured pilot current is then divided by the current measured across the on-resistance of the low side NMOSFET to produce the requisite scaling factor Ks to be used for the remaining phase section(s).

DETAILED DESCRIPTION

Figure 4:
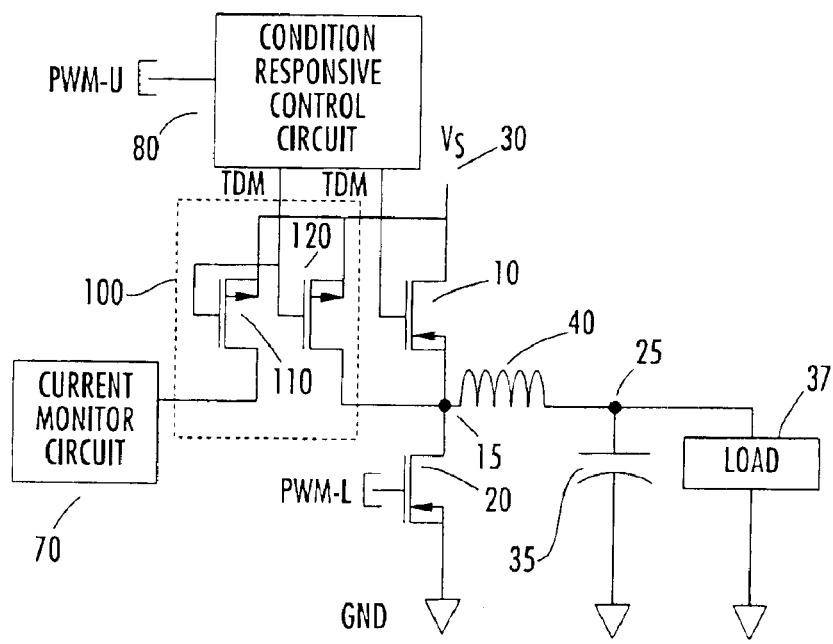
FIG. 4 is a non-limiting, but preferred embodiment of the time-division multiplexed piloted half-bridge architecture of the present invention.

A non-limiting, but preferred embodiment of the time-division multiplexed piloted half-bridge architecture of the present invention is diagrammatically illustrated in FIG. 4 as comprising an auxiliary high side switching circuit 100 containing a pair of PMOSFETs 110 and 120 that are coupled with the high side NMOSFET 10. In particular, the auxiliary circuitry 100 comprises an integrated circuit containing relatively small area pilot (current mirror) PMOSFET 110 and a companion larger area PMOSFET 120. For this purpose, the larger area PMOSFET 120 may comprise a relatively large number of parallel connected PMOSFETs, the area of an individual one of which corresponds to the area of the current mirror PMOSFET 110 to realize a prescribed scaling of the current by the ratio of the areas of the two devices. In addition, while the conductance of the PMOSFET 120 could be made proximate to that of the high side NMOSFET 10, it is preferably only a fraction (e.g., one-fourth) of the same in order to reduce the overall cost of the auxiliary circuitry. Although this reduced area entails a larger instantaneous power dissipation in the PMOSFET 120 than in the NMOSFET 10, it is still relatively small on a time-averaged basis (over tens to hundreds of switching cycles).

The pilot device 110 has its gate and source electrodes coupled in common with the respective gate and source electrodes of the PMOSFET 120, while the drain of the pilot device 110 is coupled to current monitoring circuitry 70. The gates of the two auxiliary PMOSFETs 110 and 120 are driven by a condition responsive control circuit 80, such as a sequentially clocked counter which counts pulses produced by a pulse width modulator, in the case of a periodic activation of the pilot circuit, or a load transient responsive circuit, that is intended to activate the pilot circuitry only in the event of an output anomaly. In either case, activation of the pilot circuitry occurs relatively infrequently compared to that of high side NMOSFET 10.

Figure 1:
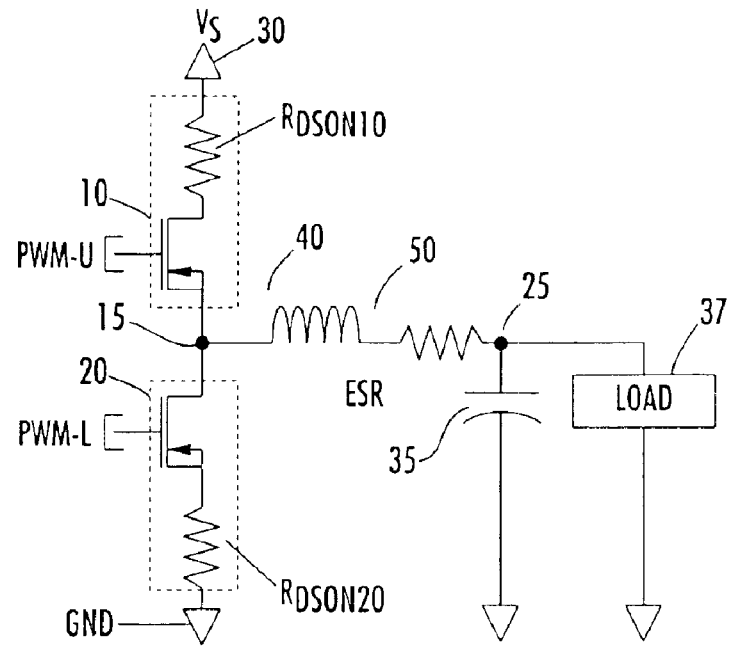
FIG. 1 is a reduced complexity diagram of a half-bridge phase of a buck mode DC-DC voltage converter.
Figure 2:
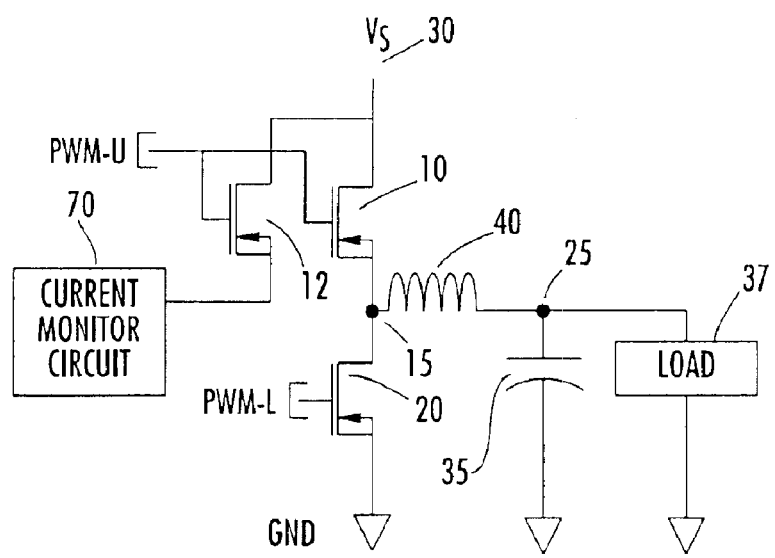
FIG. 2 diagrammatically illustrates a modification of the half-bridge of FIG. 1 to include a pilot NMOSFET switch associated with the high side NMOSFET.
Figure 3:
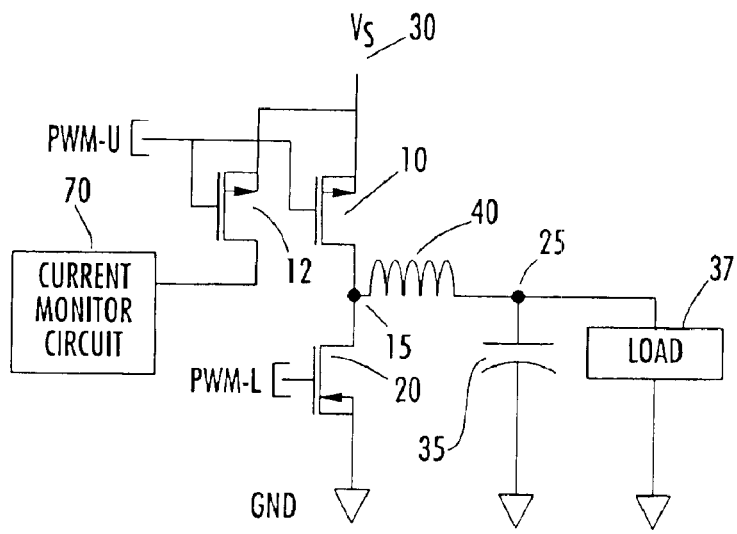
FIG. 3 diagrammatically illustrates a piloted approach similar to FIG. 2, except that the high side devices are PMOSFETs.

As in the architecture of FIG. 3, a determination of the current flow through the auxiliary high side PMOSFET 120 is based upon the current flowing through the pilot device 110 and the geometric ratio of the size of the pilot device 110 to that of the high side auxiliary PMOSFET 120. Again, with the pilot device 110 and the auxiliary high side PMOSFET 120 being located on the same substrate, thermal compensation is implicit. Also, as noted above, the ON-conductance of the auxiliary high side PMOSFET 120 is some fraction of that of the high side NMOSFET 10.

In accordance with the invention, the pilot circuitry 100 is activated on a reduced, time division multiplexed basis relative to that of the high side NMOSFET 10—for example, once for every 20 to 1000 cycles for the high side NMOSFET 10. Moreover, the two circuits are never simultaneously active. Namely, whenever the pilot circuitry 100 is activated (at some small fraction of the number of activation cycles of the high side NMOSFET 10), the high side NMOSFET 10 is not activated and, in a complementary manner, whenever the high side NMOSFET 10 is activated (which is most of the time), the pilot circuitry 100 is not activated. In effect this leads to a very efficient operation, as the high side NMOSFET 10 is activated for a very large number of switching cycles relative to the pilot circuitry 100, but the pilot circuitry is activated sufficiently often to derive a relatively accurate measure of current flow, as desired.

As a non-limiting example, consider the case of a single DC-DC converter phase, wherein the PMOSFETS 110 and 120 of the auxiliary high side monitoring circuit 100 are activated once out of every twenty switching cycles (the high side NMOSFET 10 being activated the other nineteen out of every twenty switching cycles). In addition, in order to keep the PMOSFET 110 small (and therefore less costly), it is designed to provide only one-fourth of the conductance of the NMOSFET 10. This leads to a conduction dissipation (I$^2$R) in the high side of the phase of 23/20 (or 115%) of the non-monitored case, rather than the 400% (I$^2$R) if the monitor PMOSFET circuitry simply replaced the NMOS device. The thermal load in the PMOS circuit 100 is only 1/20th or 5% of what it would be if it simply replaced the NMOS device, and is 4/19 or 21% of the dissipation of the NMOSFET 10.

Another non-limiting example of operation of the embodiment of FIG. 4 activates the auxiliary PMOSFETs 110 and 120 every switching cycle. The NMOSFET 10 is activated all cycles except those in which the current is measured. In accordance with the previous example, if the current measurement is executed once every twenty cycles, the NMOSFET is activated only nineteen of twenty cycles. During the nineteen cycles the NMOSFET and the auxiliary PMOSFETs are operated in parallel. Assuming the same 4:1 conductance ratio between the NMOSFET and the large auxiliary PMOSFET, the net power dissipation is reduced to 96% of that seen with only the NMOSFET. The power dissipation is distributed with 63% in the NMOSFET and 37% in the PMOSFET. This mode of operation increases the PMOSFET dissipation 76% over the previous exclusionary mode, but it also yields the most system benefit from the PMOSFET conductance and lowers the conductance dissipation by 4%.

It may be readily appreciated that intermittent activation or 'sampling' of the phase current by the time division multiplexed piloted scheme of the invention provides a significant improvement in the compromise between performance and cost (the piloted device being significantly more expensive per unit conductance). The penalty is a longer time between current measurements (namely every N number of cycles, as opposed to every cycle). However, as noted above, the frequency of operation of the auxiliary current-measuring MOSFETs is sufficiently often as to provide a meaningful measure of current. As long as a change in load current is not expected, there should be no significant change in the measured current on a time-averaged basis. In the event of a load transient, that event may be used to override the normal periodic measurement cycle and cause the auxiliary pilot circuitry to immediately measure current during the transient interval.

If the piloted monitoring scheme of FIG. 4 is used to 'calibrate' the value of $R_{DSON}$ of one of the low side NMOSFETs (as will be described), then at least a relative change in current information can continue to be made available at the full switching rate by conventional techniques, while the piloted current measurement is carried out at a considerably reduced rate. This constitutes an improvement of present $R_{DSON}$ monitoring schemes, which do not adaptively calibrate. The invention also allows for predictive $R_{DSON}$ vs. temperature modeling to anticipate the movement of $R_{DSON}$.

It should also be noted that the time-division multiplexed, piloted MOSFET circuit 100 may be implemented using NMOSFETs and may be applied to the low side MOSFET 20. The invention may also be used in a multiphase system, to monitor only one of multiple and similar phases to provide an improved current measurement.

As noted above, pursuant to a second aspect of the present invention, a pilot (current mirror) transistor may be used to derive an accurate scaled version of current flow in the high side FET of a selected phase of a multi phase DC-converter. This scaled version of current flow value is then ratioed with a current measurement derived by sensing the voltage drop across the on-resistance $R_{DSON}$ of the low side FET for that phase, so as to produce a current ratio proportionality constant. Current measurements for the remaining phases are conducted by sensing the voltage drops across the respective on-resistances $R_{DSON}$ for those phases and then adjusting the measured values by the proportionality constant. Variables in this technique are how well the FETs in each phase are matched to one another, and the range of variation of the absolute value of FET on-resistance. This latter factor is the limiting factor in determining the accuracy of the current measurements.

Figure 5:
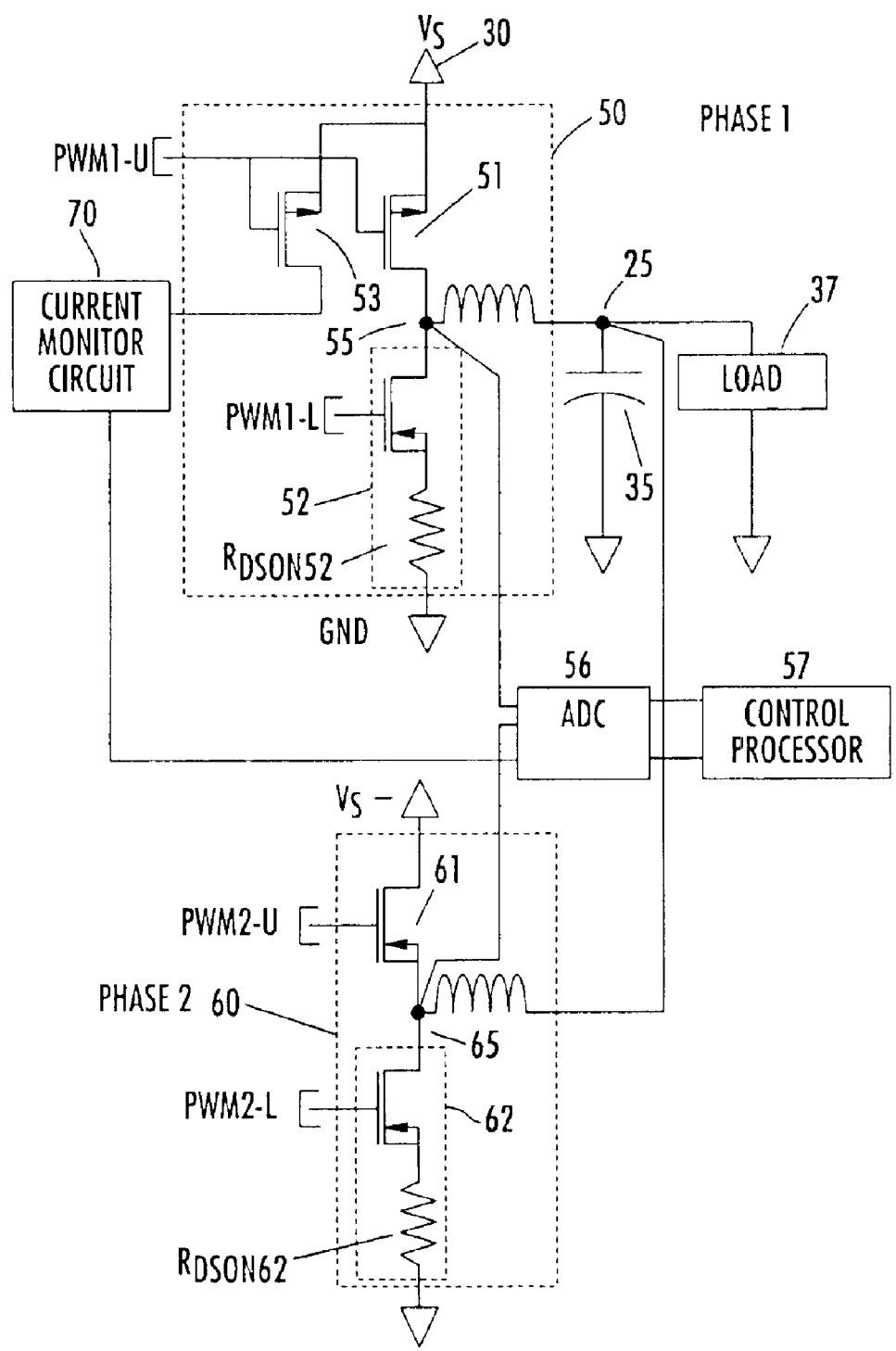
FIG. 5 shows a reduced complexity diagram of a buck mode two-phase DC converter comprised of a phase 1 section and a phase 2 section representing the second aspect of this invention.

This technique is diagrammatically illustrated in FIG. 5, which shows a reduced complexity diagram of the buck mode high side and low side FETs of a two-phase DC converter comprised of a phase 1 section 50 and a phase 2 section 60. As shown therein, phase 1 section 50 comprises a high side FET 51 having its source-drain current flow path coupled in series with a low side FET 52. An auxiliary pilot FET 53 scaled down relative to the size of FET 51 is coupled in current mirror configuration with the high side FET 51. The on-resistance of each of the low side FETs is shown as $R_{DSON}$. The voltage drop across the source and drain of the low side FET 52 is measured and then divided by the nominal specification value for the value of $R_{DSON}$, to provide a coarse measurement value of current. For this purpose, with the low side FET 52 coupled to ground, the voltage drop across its on-resistance is the voltage at the phase node 55. This voltage measurement is digitized by A-D converter 56 and then coupled to the converter's control processor 57 which carries out the current calculation based upon the measured voltage across $R_{DSON}$.

The current mirror or pilot transistor 53 provides a scaled version of the actual current through high side FET 51 and thereby through low side FET 52. This current value is digitized and coupled to the control processor wherein it is divided by the coarse current measurement value of the low side FET 52 to produce a current scaling constant Ks. Multiplying the coarse current measurement value derived across $R_{DSON}$ by Ks yields the accurately calibrated current value.

For the present two phase example, the remaining phase 2 section 60 comprises a high side FET 61 having its source-drain current flow path coupled in series with low side FET 62. However, unlike phase 1, there is no auxiliary pilot FET corresponding to FET 53 of phase 1. The on-resistance of the low side FET 62 is shown as $R_{DSON62}$. As in the phase 1 measurement, the voltage drop across the source and drain of the low side FET 62 is measured and then divided by the nominal specification value for the value of $R_{DSON62}$, to provide a coarse measurement or proximate value of current through the phase 2 section 60. In order to calibrate this current measurement, the coarse current value for the phase 2 section is multiplied by the current scaling constant Ks derived in the phase 1 section. As in the phase 1 section, multiplying the coarse current measurement value derived across $R_{DSON62}$ by Ks yields a calibrated current value for the phase 2 current.

Figure 6:
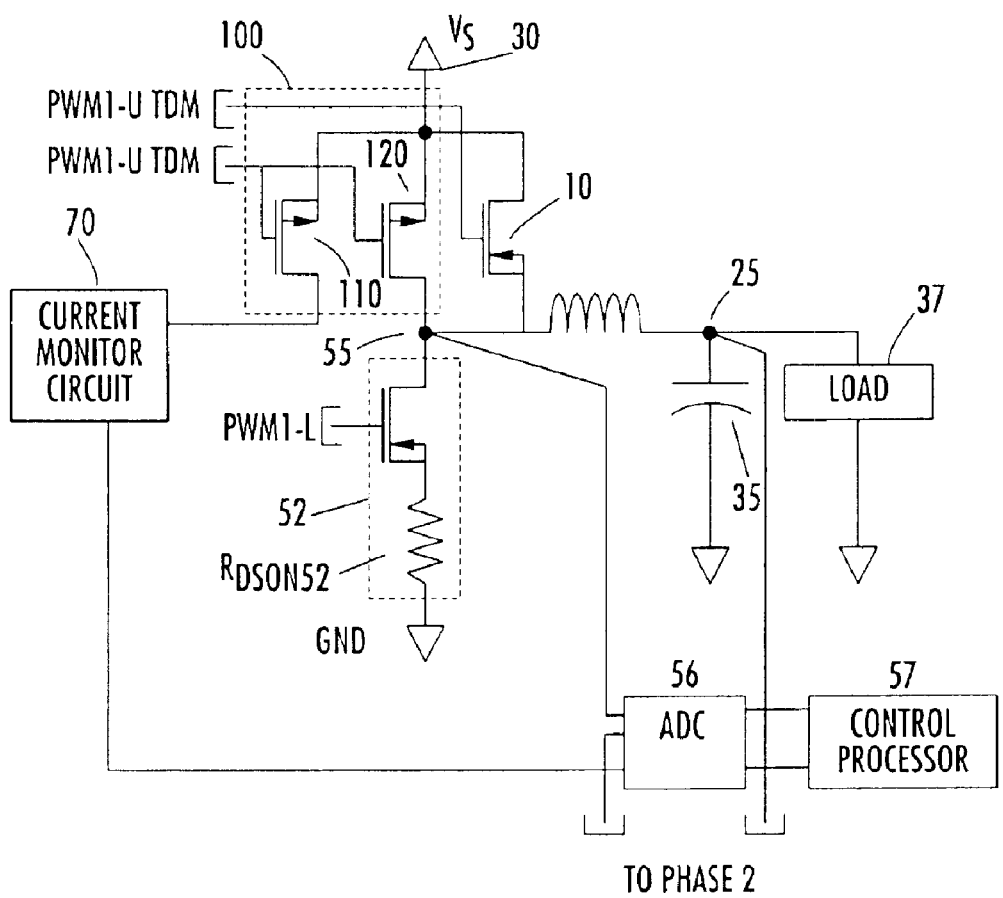
FIG. 6 shows a replacement of the current mirror or pilot transistor of the embodiment of FIG. 5 by the auxiliary circuitry of FIG. 4 containing the relatively small area pilot PMOSFET switch and its companion larger area PMOSFET.

According to a third aspect of the present invention, the time division multiplex methodology of the first embodiment is substituted for the pilot current measurement scheme carried out in the second embodiment to derive the current measurement scaling factor of the second embodiment. This is diagrammatically illustrated in FIG. 6, wherein the current mirror or pilot transistor 53 of the embodiment of FIG. 5 is replaced by the auxiliary circuitry 100 of FIG. 4 containing the relatively small area pilot PMOS switch 110 and its companion larger area PMOSFET 120. As in that embodiment, the pilot circuitry 100 in the phase 1 section of the embodiment of FIG. 6 is activated on a reduced, time division multiplexed basis relative to that of the high side NMOSFET 10, for example, once for every 20 to 1000 cycles for the high side NMOSFET 10, as described above. This periodically measured pilot current is then divided by the current measured across the on-resistance $R_{DSON52}$, to produce the requisite scaling factor Ks to be used for the remaining phase section(s).

As will be appreciated from the foregoing description, current monitoring problems associated with conventional piloted buck mode half bridge DC-DC converter designs may be substantially reduced by configuring the basic half-bridge architecture as a time-division multiplexed piloted circuit architecture, wherein current measurements conducted by auxiliary pilot-based current measurement circuitry are conducted on an intermittent basis relative to the activation frequency of a high side or low side MOSFET with which the pilot-based current measurement circuitry is associated. Moreover such a multiplexed approach may be applied to a current measurement scaling methodology of a multiphase architecture to produce the requisite scaling factor Ks to be used for the remaining phase section(s).

While we have shown and described several embodiments in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. For use with a DC-DC voltage converter having a controller which generates a pulse width modulation (PWM) switching signal that switchably controls operation a switching circuit containing first and second electronic power switching devices coupled between respective power supply terminals, and having a phase node thereof coupled through an inductor to a regulated voltage output terminal, an arrangement for deriving a measure of current through said inductor comprising:

a pilot electronic power switching device coupled with one of said first and second electronic power switching devices and having a current flow path therethrough coupled to a current measurement terminal; and a controller that is operative to time division multiplex the activation of said pilot electronic power switching device relative to the activation of said one of said first and second electronic power switching devices.

2. The arrangement according to claim 1, further including an auxiliary electronic power switching device having a current flow path therethrough coupled in parallel with a current flow path through one of said first and second electronic power switching devices, and control electrode thereof coupled in common with a control electrode of said pilot electronic power switching device.

3. The arrangement according to claim 1, wherein said one of said first and second electronic power switching devices comprises a high side electronic power switching device.

4. The arrangement according to claim 1, wherein said controller is operative to periodically time division multiplex the activation of said pilot electronic power switching device relative to the activation of said one of said first and second electronic power switching devices.

5. The arrangement according to claim 1, wherein said controller is operative to time division multiplex the activation of said pilot electronic power switching device relative to the activation of said one of said first and second electronic power switching devices in response to a prescribed operational condition of said DC-DC voltage converter.

6. The arrangement according to claim 5, wherein said controller is operative to activate said pilot electronic power switching device in response to a transient in said current through said inductor.

7. For use with a DC-DC voltage converter having a controller which generates a pulse width modulation (PWM) switching signal that switchably controls operation a switching circuit containing first and second electronic power switching devices coupled between respective power supply terminals, and having a phase node thereof coupled through an inductor to a regulated voltage output voltage terminal, an arrangement for deriving a measure of current through said inductor comprising:

an auxiliary electronic power switching circuit containing an auxiliary electronic power switching device having a current flow path therethrough coupled in parallel with a current flow path through one of said first and second electronic power switching devices, and a pilot electronic power switching device having a control electrode thereof coupled in common with a control electrode of said auxiliary electronic power switching device, said pilot electronic power switching device having a current flow path therethrough coupled to a current measurement terminal; and a controller that is operative to time division multiplex the activation of said auxiliary electronic power switching circuit relative to the activation of said one of said first and second electronic power switching devices.

8. The arrangement according to claim 7, wherein said one of said first and second electronic power switching devices comprises a high side electronic power switching device.

9. The arrangement according to claim 7, wherein said controller is operative to periodically time division multiplex the activation of said auxiliary electronic power switching circuit relative to the activation of said one of said first and second electronic power switching devices.

10. The arrangement according to claim 7, wherein said controller is operative to time division multiplex the activation of said auxiliary electronic power switching circuit relative to the activation of said one of said first and second electronic power switching devices in response to a prescribed operational condition of said DC-DC voltage converter.

11. The arrangement according to claim 10, wherein said controller is operative to activate said auxiliary electronic power switching circuit in response to a transient in said current through said inductor.

12. For use with a DC-DC voltage converter having a controller which generates a pulse width modulation (PWM) switching signal that switchably controls operation a switching circuit containing first and second electronic power switching devices coupled between respective power supply terminals, and having a phase node thereof coupled through an inductor to a regulated voltage output voltage terminal, a method for deriving a measure of current through said inductor comprising the steps of:

(a) coupling a pilot electronic power switching device to one of said first and second electronic power switching devices, said pilot electronic switching device having a current flow path therethrough coupled to a current measurement terminal; and (b) time division multiplexing the activation of said pilot electronic power switching device relative to the activation of said one of said first and second electronic power switching devices.

13. The method according to claim 12, wherein step (a) includes coupling a current flow path of an auxiliary electronic power switching device in parallel with a current flow path through one of said first and second electronic power switching devices, and coupling a control electrode thereof in common with a control electrode of said pilot electronic power switching device, so that step (b) comprises time division multiplexing the activation of said auxiliary electronic power switching device relative to the activation of said one of said first and second electronic power switching devices.

14. The method according to claim 12, wherein said one of said first and second electronic power switching devices comprises a high side electronic power switching device.

15. The method according to claim 12, wherein step (b) comprises periodically time division multiplexing the activation of said pilot electronic power switching device relative to the activation of said one of said first and second electronic power switching devices.

16. The method according to claim 12, wherein step (b) comprises time division multiplexing the activation of said pilot electronic power switching device relative to the activation of said one of said first and second electronic power switching devices in response to a prescribed operational condition of said DC-DC voltage converter.

17. The method according to claim 16, wherein step (b) comprises activating said pilot electronic power switching device in response to a transient in said current through said inductor.

18. For use with a multiphase DC-DC voltage converter having a controller which generates a pulse width modulation (PWM) switching signal that switchably controls operation of respective multiphase-associated switching circuits, a respective one of which contains first and second electronic power switching devices coupled between respective power supply terminals in a respective phase section of DC-DC converter, a respective phase section having a phase node thereof coupled through an inductor to a regulated voltage output voltage terminal, a method for deriving a measure of current through the inductor of an arbitrary phase section comprising the steps of:

(a) coupling a pilot electronic power switching device to one of said first and second electronic power switching devices of a first phase section, said pilot electronic switching device having a current flow path therethrough coupled to a current measurement terminal and measuring a first current through said pilot electronic power switching device;

(b) measuring a second current through an on-resistance of another of said first and second power switching devices of said first phase section;

(c) deriving a ratio of said first current to said second current to provide a current calibration constant Ks;

(d) measuring a third current through an on-resistance of one of said first and second power switching devices of a second phase section; and (e) modifying said third current measured in step (d) in accordance with said current calibration constant Ks derived in step (c) to realize a fourth, calibrated current representative of the actual current through the inductor of said second phase section.

19. The method according to claim 18, wherein step (a) comprises time division multiplexing the activation of said pilot electronic power switching device relative to the activation of said one of said first and second electronic power switching devices and measuring said first current through said pilot electronic power switching device.

20. The method according to claim 18, wherein step (a) comprises periodically time division multiplexing the activation of said pilot electronic power switching device relative to the activation of said one of said first and second electronic power switching devices.

* * * * *